(12) United States Patent
Yen et al.

(10) Patent No.: US 10,074,512 B2
(45) Date of Patent: Sep. 11, 2018

(54) SYSTEM AND METHOD FOR SETTING A TEMPERATURE OF AN OBJECT WITHIN A CHAMBER

(71) Applicant: APPLIED MATERIALS ISRAEL LTD., Rehovot OT (IL)

(72) Inventors: Chun-Hsiang Yen, Magong (TW); Barak Dee-Noor, Herzelia (IL); Yuval Gronau, Ramat Hasharon (IL); Ronen Hagai, Kiryat Ekron (IL); Efim Vinnitsky, Ashkelon (IL); Yohanan Madmon, Kiryat Eqron (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 331 days.

(21) Appl. No.: 14/795,795

(22) Filed: Jul. 9, 2015

(65) Prior Publication Data
US 2017/0011882 A1 Jan. 12, 2017

(51) Int. Cl.
| | | |
|---|---|---|
| G05D 23/00 | (2006.01) |
| H01J 37/24 | (2006.01) |
| H01J 37/20 | (2006.01) |
| H01L 21/67 | (2006.01) |
| H01L 21/68 | (2006.01) |
| G03F 7/20 | (2006.01) |
| H01L 21/66 | (2006.01) |

(52) U.S. Cl.
CPC .......... *H01J 37/24* (2013.01); *G03F 7/70875* (2013.01); *H01J 37/20* (2013.01); *H01L 21/67248* (2013.01); *H01L 21/68* (2013.01); *H01J 2237/002* (2013.01); *H01J 2237/20278* (2013.01); *H01L 22/12* (2013.01)

(58) Field of Classification Search
CPC ... C23C 16/46; C23C 16/463; C23C 18/1678; G05B 2219/49057; G03F 7/70875; H01J 2237/002; H01J 2237/20278; H01J 37/24; H01J 37/20; H01L 22/12; H01L 23/34; H01L 23/345; H01L 23/38; H01L 23/473; H01L 21/67248; H01L 21/68; H01L 21/67103; H01L 21/68792
See application file for complete search history.

(56) References Cited

U.S. PATENT DOCUMENTS

| | | | | |
|---|---|---|---|---|
| 6,032,724 A * | 3/2000 | Hatta | ................. | G01R 31/2855 118/724 |
| 6,392,205 B1 * | 5/2002 | Minonishi | ......... | H01L 21/67103 219/443.1 |
| 2004/0250776 A1 * | 12/2004 | Mizuochi | ............ | G03F 7/70841 118/728 |

(Continued)

*Primary Examiner* — Travis Ruby
(74) *Attorney, Agent, or Firm* — Kilpatrick Townsend & Stockton LLP

(57) ABSTRACT

A system that may include a chamber, a motorized system, a chuck, a controller, multiple temperature sensors and a cooling module; wherein the chuck is configured to support an object that is positioned within the chamber; wherein the motorized system is configured to move the chuck in relation to the chamber; wherein the multiple temperature sensors are configured to sense multiple temperatures of at least one point within the chamber; wherein the cooling module is configured to cool a unit of the motorized system; and wherein the controller is configured to control the cooling module in response to the multiple temperatures.

17 Claims, 11 Drawing Sheets

(56) References Cited

U.S. PATENT DOCUMENTS

| | | | |
|---|---|---|---|
| 2008/0151202 A1* | 6/2008 | Ohishi | G03F 7/70716 355/30 |
| 2009/0061539 A1* | 3/2009 | Motoyama | H01L 21/67248 438/5 |
| 2013/0220575 A1* | 8/2013 | Ptasienski | H05B 3/20 165/61 |

* cited by examiner

SYSTEM AND METHOD FOR SETTING A TEMPERATURE OF AN OBJECT WITHIN A CHAMBER

BACKGROUND OF THE INVENTION

Objects such as wafers are manufactured by highly complicated manufacturing processes. These manufacturing processes should be monitored in order to ensure the quality of the wafers.

The monitoring process may include (a) using an inspection tool for performing an inspection process to detect potential defects, and (b) using a review tool for performing a review of the potential defects.

The inspection tool may illuminate the object by one or more beams of electrons, ions or by one or more beams of optical, ultraviolet, deep ultraviolet or extreme ultraviolet radiation. The review tool usually illuminates the objects using one or more electron beams or one or more an ion beams.

Each tool of the inspection tool and the review tool may scan the object (or only parts of the object) by introducing a mechanical movement between the object and either the optical or electron optics.

The mechanical movement is usually introduced by a motorized system that may include one or more mechanical stages. A mechanical stage may be an XYZ-stage that is configured to support the object and to move the object along imaginary X-axis, Y-axis and Z-axis.

The movements of the motorized system cause the motorized system to heat. The heating of the motorized system may result in navigation errors.

There is a growing need to reduce navigation errors, especially in highly accurate systems.

BRIEF SUMMARY OF THE INVENTION

According to an embodiment of the invention there may be provided a system that may include a chamber, a motorized system, a chuck, a controller, multiple temperature sensors and a cooling module; wherein the chuck may be configured to support an object that may be positioned within the chamber; wherein the motorized system may be configured to move the chuck in relation to the chamber; wherein the multiple temperature sensors may be configured to sense multiple temperatures of at least one point within the chamber; wherein the cooling module may be configured to cool a unit of the motorized system; and wherein the controller may be configured to control the cooling module in response to the multiple temperatures.

The unit of the motorized system may be a base of the motorized system.

The unit of the motorized system may be a mechanical stage of the motorized system.

The motorized system may include a first mechanical stage and a second mechanical stage; wherein the first mechanical stage may be positioned between the chuck and the second mechanical stage; and wherein the unit of the motorized system may be the second mechanical stage.

The system may include a chuck heating module that may be configured to heat the chuck.

The chuck heating module may be configured to heat the chuck in parallel to a cooling of the unit of the motorized system by the cooling module.

The chuck heating module may be configured to change a temperature of the chuck within a first temperature range; and wherein the cooling module may be configured to change a temperature of the unit of the motorized system within a second temperature range; and wherein the second temperature range exceeds the first temperature range.

The controller may be configured to send movement commands for controlling movements introduced by the motorized system.

The controller may be configured to control the cooling module in response to the movement commands and to the multiple temperatures.

The controller may be configured to send temperature control commands to the cooling module before the multiple temperature sensors sense a change of temperature induced by the movements of the motorized system.

The controller may be configured to send temperature control commands to the cooling module that when implemented by the cooling module prevent the movements of the motorized system from substantially altering the multiple temperatures sensed within the chamber.

The controller may be configured to provide an estimated heat generated by the motorized system when executing the movement commands; and wherein the controller may be configured to control the cooling module in response to the estimated heat.

The controller may be configured to control the cooling module in response to the multiple temperatures by applying control iterations.

The controller may be configured to determine whether to initiate a control iteration; and wherein the determining may be responsive to navigation errors of the motorized system.

The controller may be configured to control the cooling module in response to the multiple temperatures and to navigation errors of the motorized system.

The system may include an ambient temperature sensor for sensing an ambient temperature outside the chamber.

The cooling module may be configured to cool the unit of the motorized system thereby causing the chuck to be at the ambient temperature.

The cooling module may be configured to cool the unit of the motorized system thereby causing the chuck to be at a chuck temperature that differs from the ambient temperature.

The system may include a chuck heating module that may be configured to heat the chuck; and wherein the cooling module may be configured to cool the unit of the motorized system and the chuck heating module may be configured to heat the chuck thereby causing the chuck to be at the ambient temperature.

The cooling module may include a liquid-based cooling module that may be at least partially integrated with the unit of the motorized system.

The cooling module may include a gas-based cooling module that may be at least partially integrated with the unit of the motorized system.

The cooling module may include Peltier cooling elements.

According to an embodiment of the invention there may be provided a method for maintaining a stable temperature within a chamber, the method may include supporting, by a chuck, an object that is positioned within a chamber; moving, by a motorized system, the chuck in relation to the chamber; sensing, by multiple temperature sensors, multiple temperatures of at least one point within the chamber; cooling, by a cooling module, a unit of the motorized system; and controlling, by a controller, the cooling of the unit of the motorized system, in response to the multiple temperatures.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
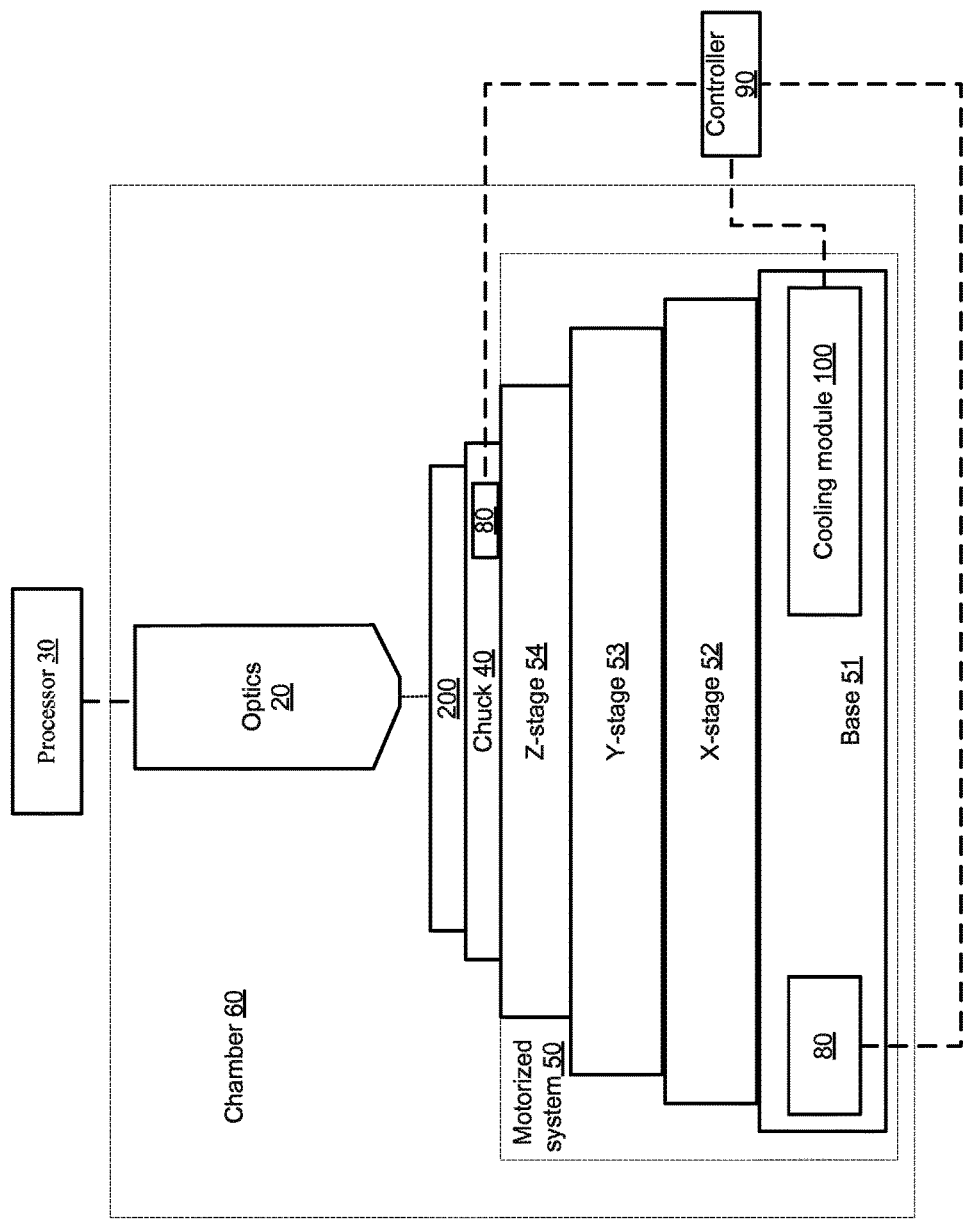
FIG. 1 illustrates a system and an object according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

FIG. 1 is a side view of system 10 that supports an object 200 according to an embodiment of the invention.

System 10 may be an inspection tool (optical inspection tool or charged particle beam inspection tool), a review tool (such as but not limited to a scanning electron microscope, a transmissive electron microscope), an aerial inspection tool, a stepper, a lithography tool, an atomic force microscope (AFM), and the like.

System 10 includes optics 20, processor 30, chuck 40, motorized system 50, chamber 60, temperature sensors 80, controller 90 and cooling module 100.

Controller 90 may control various components of system 10. In FIGS. 1-9 some of the controlled elements are linked by dashed lines to controller 90 while other controlled elements are not linked by dashed lines to controller 90—for simplicity of explanation.

Object 200 may be a wafer, a die, a flat panel display, a photolithographic mask, a solar panel, a micro-electromechanical-system, a nano-electro-mechanical-system, a substrate or any other object.

Optics 20 is arranged to illuminate the entire object or only parts of object 200 with one or more beams.

For simplicity of explanation it is assumed that the optics 20 is an electron optics and that optics is configured to illuminate the object with a single electron beam.

Optics 20 may require a predefined vacuum level in order to operate in an acceptable manner. This predefined vacuum level may be maintained within chamber 60 in various known manners.

Chuck 40 is configured to support object 200 when object 200 is positioned within chamber 60.

Motorized system 50 is configured to move chuck 40 (and therefore the object) in relation to the chamber 60.

Motorized system 50 can perform linear movements, non-linear movements or a combination of linear and non-linear movements. For example—motorized system 50 can perform movements along an x-axis, along a y-axis and along a z-axis. Yet for another example—motorized system can perform rotational movements and movements along the z-axis.

Motorized system 50 may include multiple units such as base 51, X-stage 52, Y-stage 53 and Z-stage 54. Additionally or alternatively, motorized system 50 may include a rotating stage or any other combination of mechanical stages.

Temperature sensors 80 may be positioned at different points of chamber 60.

For example, a temperature sensor may be allocated per each one of chuck 40, base 51, X-stage 52, Y-stage 53 and Z-stage 54.

Yet for another example, more than a single temperature sensor may be allocated per chuck 40 and/or per a unit of motorized system 50.

Yet for another example, temperature sensors may be allocated per some of the units of motorized system 50 but not for all units of motorized system 50.

In FIG. 1 temperature sensors 80 are allocated per chuck 40 and per base 51.

In FIG. 1, cooling module 100 is thermally coupled to base 51 and is configured to cool base 51. It is noted that cooling module 100 may be thermally coupled to any unit of motorized system 50—including but not limited X-stage 52, Y-stage 53 and Z-stage 54.

It is further noted that system 10 may include more than a single cooling module and that more than a single unit of motorized system 50 can be directly cooled by cooling module 100.

Controller 90 is configured to control cooling module 100 in response to the multiple temperatures sensed by temperature sensors 80. Controller 90 may average or apply any other mathematical function on temperatures readings provided by one of more temperature sensors 80.

Controller 90 may control the cooling module 100 by sending temperature control commands.

Cooling module 100 may be configured to cool any unit of motorized system 50. In FIG. 1 cooling module 100 is illustrated as cooling the base 51.

Cooling module 100 may operate as a heat pump.

Cooling module 100 may be tailored to operate in highly vacuumed and low vibration environments such as chamber 60.

Cooling module 100 may be a liquid-based cooling module that is at least partially integrated with the unit of the motorized system. For example—pipes of cooling module 100 may pass through base 51 and may cool base 51 by conveying cooled liquids.

Cooling module 100 may be a gas-based cooling module that is at least partially integrated with the unit of the motorized system. For example—pipes of cooling module 100 may pass through base 51 and may cool base 51 by conveying cooled gas.

Cooling module 100 may include Peltier cooling elements such as Peltier plates that are connected or otherwise thermally coupled to base 51.

Controller 90 can be configured to perform a learning period during which a first relationship between the cooling efforts applied by cooling module 100 and the temperature of chuck 40. The controller 90 may use the first relationship in order to determine the amount of cooling efforts to perform in order to obtain a desired chuck temperature. Alternatively, the first relationship can be fed to controller 90.

Controller 90 can be configured to perform a learning period during which a second relationship between movements of motorized system 50 and the temperature of chuck 40. The second relationship represents an estimated heat generated by the motorized system 50 when executing movement commands.

Controller 90 may use this second relationship in order to counter, reduce or prevent chuck temperature changes resulting from motorized system 50 movements. Alternatively, the second relationship can be fed to controller 90. For example—when estimating that a certain heat power is to be generated as a result of a movement of motorized system 50, the cooling module 100 may be commanded to generate an equivalent cooling power.

According to an embodiment of the invention, controller 90 is configured to control the movements of motorized system 50. Controller 90 may send movement commands to motorized system 50 for controlling movements introduced by the motorized system 50.

Controller 90 may be configured to determine how to control the cooling module 100 in response to movement command sent to the motorized system 50.

Controller 90 may use the second relationship in order to determine the temperature control commands to send to cooling module 100. Once executed by cooling module 100 the temperature control commands may counter, reduce or eliminate any heating effects introduced by the movements of motorized system 50. Thus, controller 90 may perform a feed-forward operation in which controller 90 does not merely react to temperature reading but actively operates in order to prevent the occurrence of temperature changes.

The feed-forward operation can be made in response to a real time calculation of actual power dissipation and may improve the dynamic response of the control loop and may minimize temperature fluctuations.

The temperature control commands may be sent in proximity to the sending of the movement commands—shortly before the sending of the movement commands, in parallel to the sending of the movement commands or shortly after sending the movement commands. The term shortly may include few seconds or few fractions of a second.

According to an embodiment of the invention a temperature control commands is sent before a corresponding movement command in order to allow cooling module 100 to cool base 51 to a desired temperature that counters the expected heating of base 51 by the movement of the motorized system 50.

The temperature control commands may be set to cooling module before the actual movement of motorized system 50 in order to prevent the movements to introduce a temperature change that can by sensed by temperature sensors 80.

According to an embodiment of the invention, processor 30 may process images acquired by optics 20 in order to determine navigation errors. A navigation error may occur when optics 20 direct a beam to a certain location but the beam impinges on another location. The navigation error may be contributed to deformations in the motorized system 50 that may result from heating.

Once navigation errors are detected, or at least navigation errors of predefined magnitude are detected, controller 90 can initiate a control iteration during which controller 90 reads temperatures sensed by temperature sensors 80 and may determine to change the temperature of motorized system 50.

Navigation errors can be searched in a periodic manner, in a random manner, in a pseudo-random manner, and the like.

Figure 2:
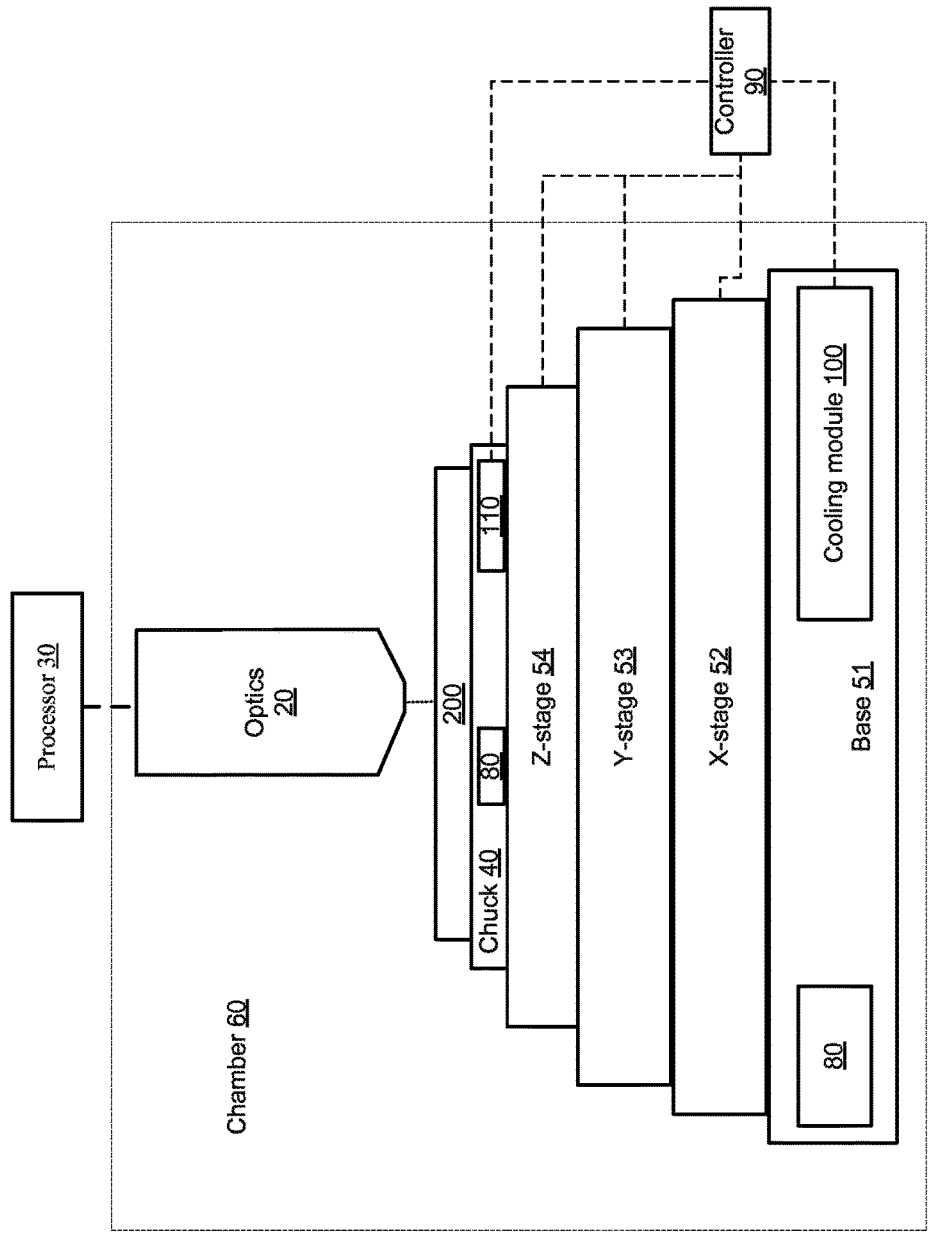
FIG. 2 illustrates a system and an object according to an embodiment of the invention.

FIG. 2 illustrates system 11 according to an embodiment of the invention.

System 11 differs from system 10 of FIG. 1 by having chuck heating module 110. Chuck heating module 110 is configured to heat chuck 40.

The temperature of chuck 40 can be directly affected by chuck heating module 110 and can be indirectly affected by cooling module 100.

Cooling module 100 cools a unit of motorized system 50 and this cooling influences the temperatures of other units of motorized system 50 and influences the temperature of chuck 40.

There may be differences between cooling module 100 and chuck heating module 110. First—a cooling operation is more complex than a heating operation. Second—while cooling module 100 may be stationary, chuck heating module 110 is moved by motorized system 50. Due to these differences it may be beneficial to use a chuck heating module 110 that is smaller than cooling module 100.

Accordingly—the cooling module 100 can provide more extensive temperature changes and the chuck heating module 110 can introduce more delicate changes to the temperature of the chuck.

Accordingly—chuck heating module 110 may be configured to change a temperature of the chuck within a first temperature range. Cooling module 100 may be configured to change a temperature of the base 51 within a second temperature range. The second temperature range may exceed the first temperature range.

Cooling module 100 may cool base 51 to a temperature that will cause chuck 40 to be at a chuck temperature that is lower than a desired value and the chuck heating module 110 may heat the chuck 40 to be at the desired chuck temperature.

The heating of chuck 40 may be much faster than the indirect cooling of chuck 40 by cooling module 100. Accordingly—the chuck heating module may fine tune the temperature of chuck 40 in a relatively fast manner.

The cooling module 100 may operate in parallel to the chuck heating module 110.

Controller 90 can independently control cooling module 100 and chuck heating module 110.

Controller 90 and temperature sensors 80 may apply a first control loop for controlling cooling module 100 and a second control loop for controlling chuck heating module 110. Alternatively, controller 90 and temperature sensors 80 may apply a single control loop for controlling both cooling module 100 and chuck heating module 110.

Figure 3:
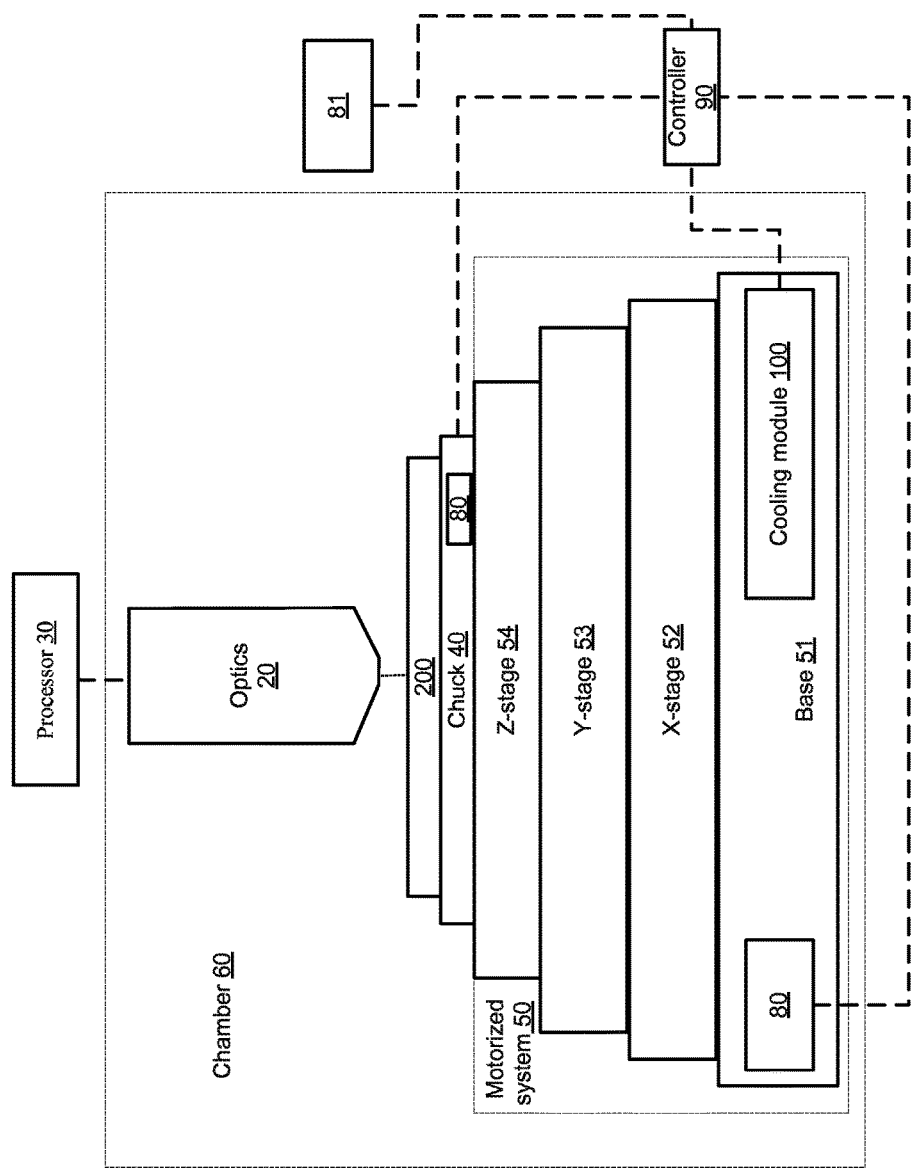
FIG. 3 illustrates a system and an object according to an embodiment of the invention.

FIG. 3 illustrates system 12 according to an embodiment of the invention.

System 12 differs from system 10 of FIG. 1 by having an ambient temperature sensor 81.

Ambient temperature sensor 81 may sense the temperature of the vicinity of chamber 60 and especially the temperature to which object 200 is subjected before entering chamber 60.

It may be desired to set the chuck to the ambient temperature sensed by ambient temperature sensor 81.

It is noted that system 12 may also include a chuck heating module (not shown) and that controller 90 may control the cooling module 100 and the chuck heating module 110 to operate in order to set the chuck to the ambient temperature.

Figure 4:
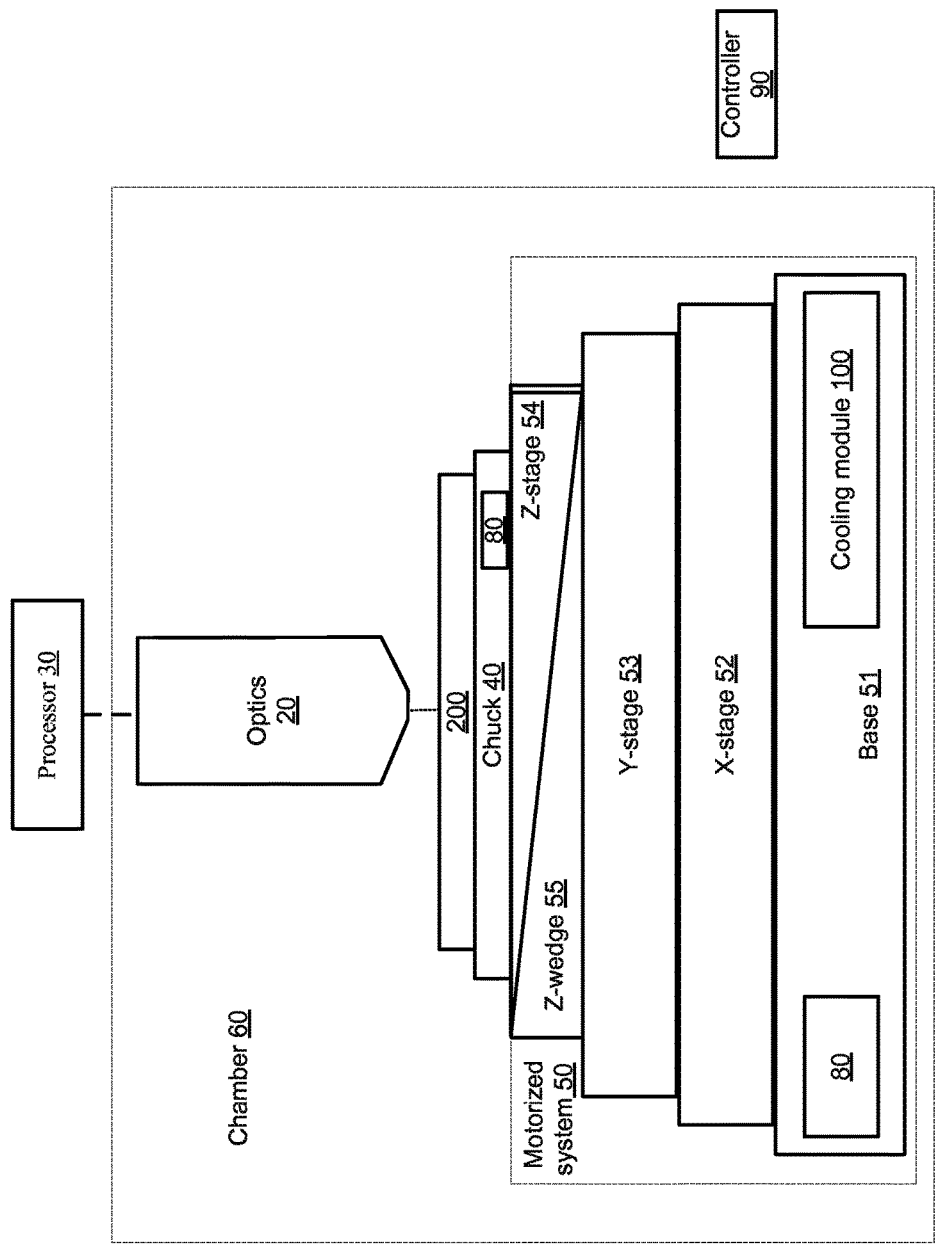
FIG. 4 illustrates a system and an object according to an embodiment of the invention.

FIG. 4 illustrates system 13 according to an embodiment of the invention.

System 13 differs from system 10 of FIG. 1 by having a z-wedge 55 between Z-stage 54 and Y-stage 53.

Horizontal movements of z-wedge 55 result in vertical movements of Z-stage 54.

Z-wedge 55 is one of the units of motorized system 50. Cooling module 100 can directly cool z-wedge 55 or any other unit of motorized system 50.

Figure 5:
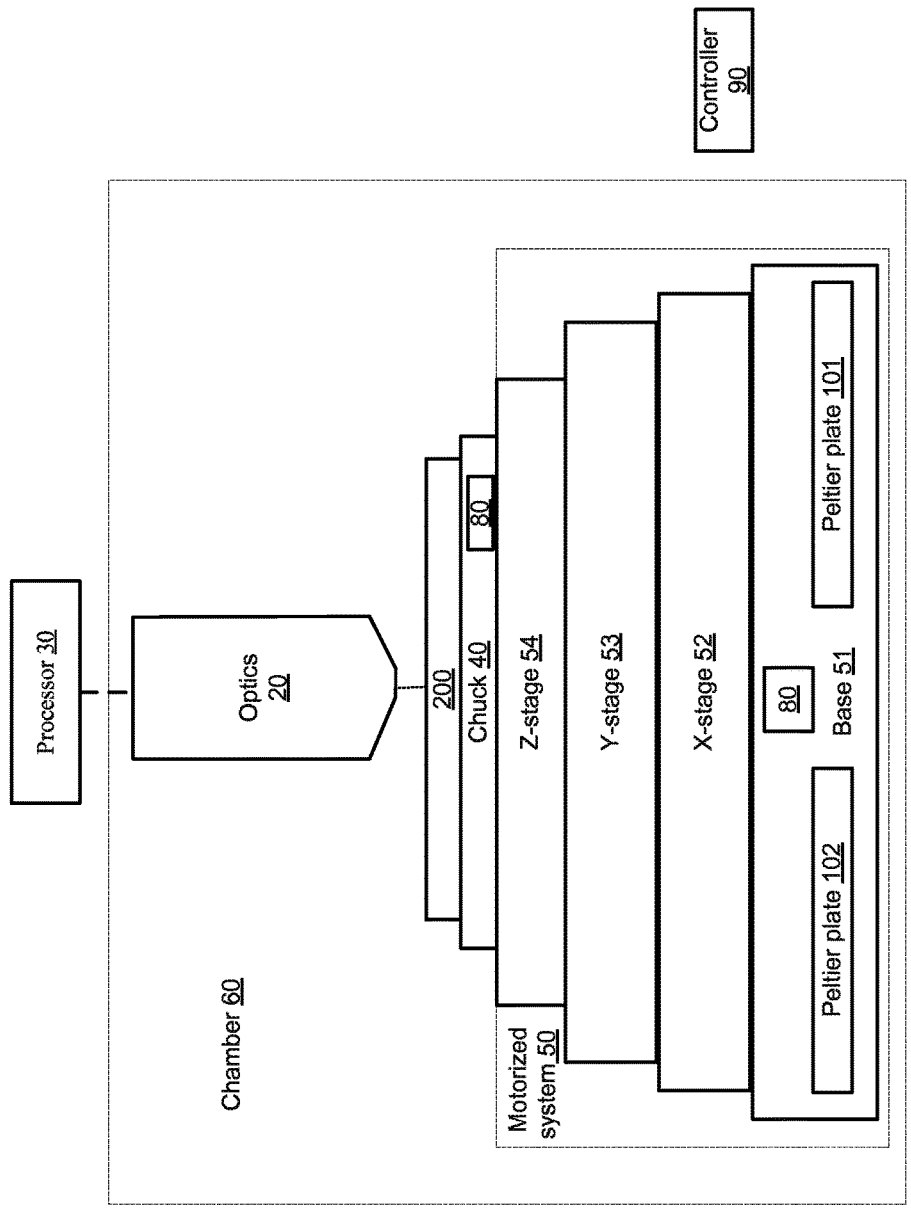
FIG. 5 illustrates a system and an object according to an embodiment of the invention.

FIG. 5 illustrates system 14 according to an embodiment of the invention.

FIG. 5 illustrates cooling module 100 as including a plurality of Peltier plates 101 and 102.

Figure 6:
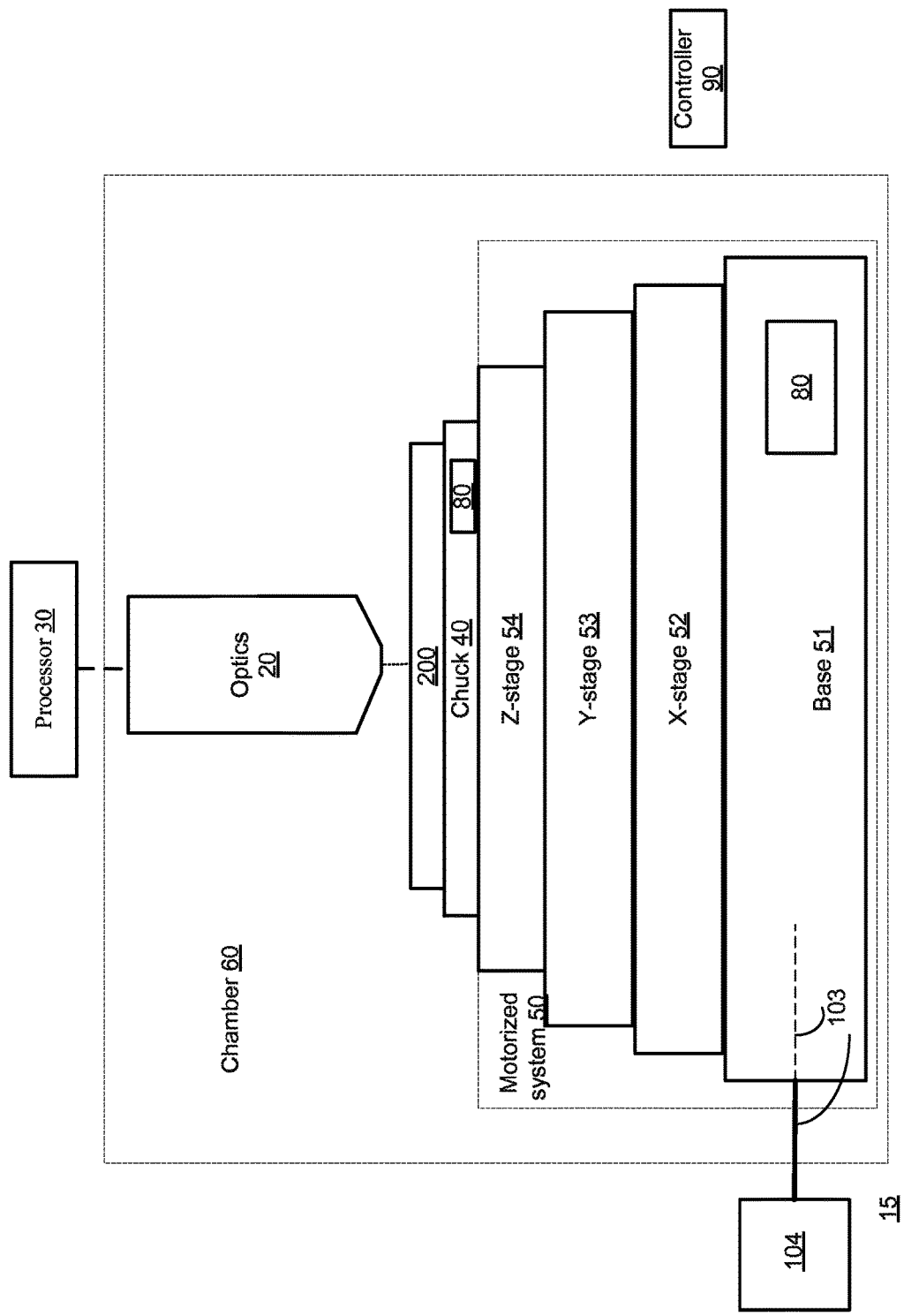
FIG. 6 illustrates a system and an object according to an embodiment of the invention.

FIG. 6 illustrates system 15 according to an embodiment of the invention.

FIG. 6 illustrates cooling module 100 as being a liquid-based cooling system that includes cooled liquid source 104 and cooled liquid pipes 103 for conducting cooled liquid into base 51.

Figure 7:
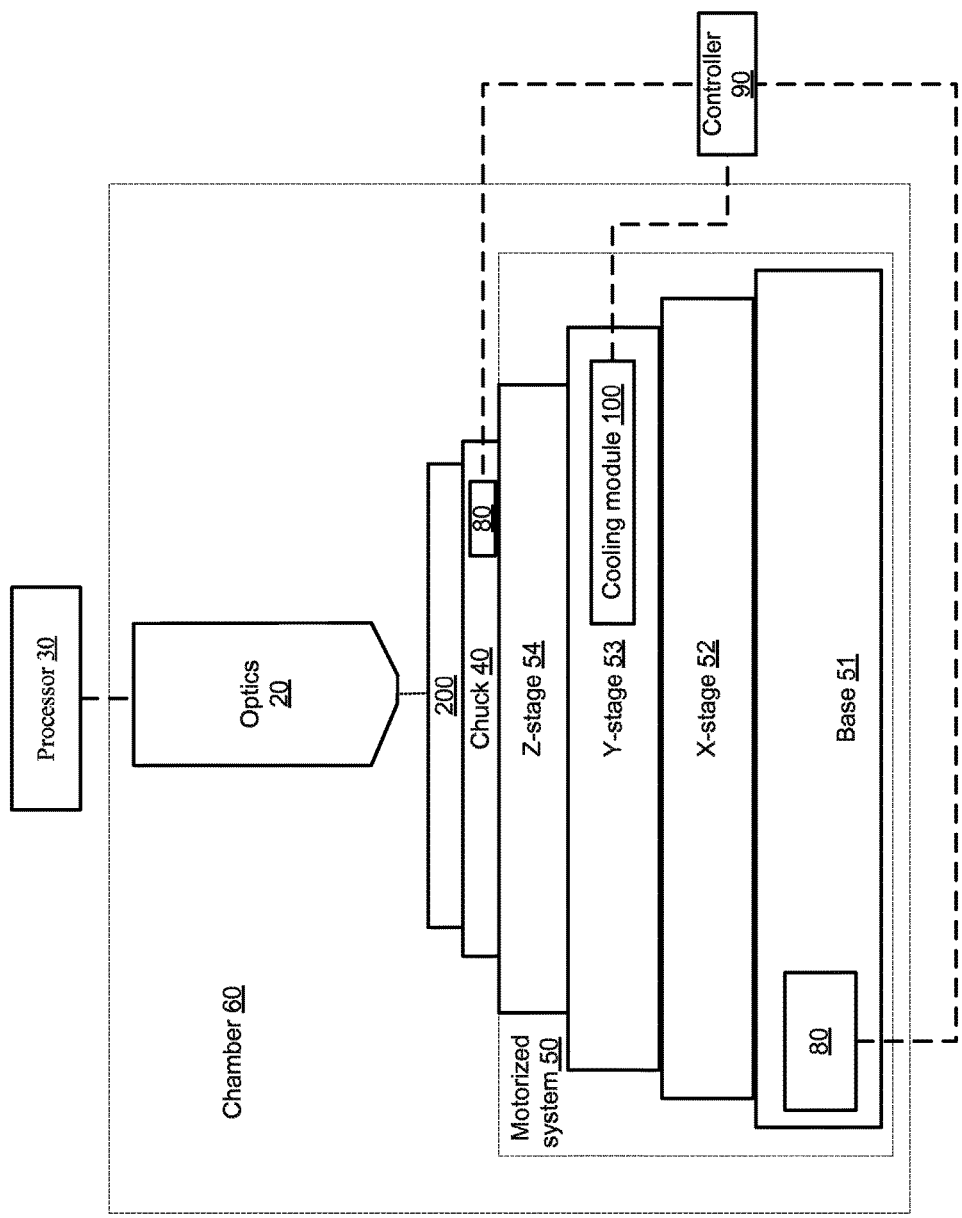
FIG. 7 illustrates a system and an object according to an embodiment of the invention.

FIG. 7 illustrates system 16 according to an embodiment of the invention.

FIG. 7 illustrates cooling module 100 as directly cooling Y-stage 53 and not cooling base 51—as illustrated in FIG. 1.

Figure 8:
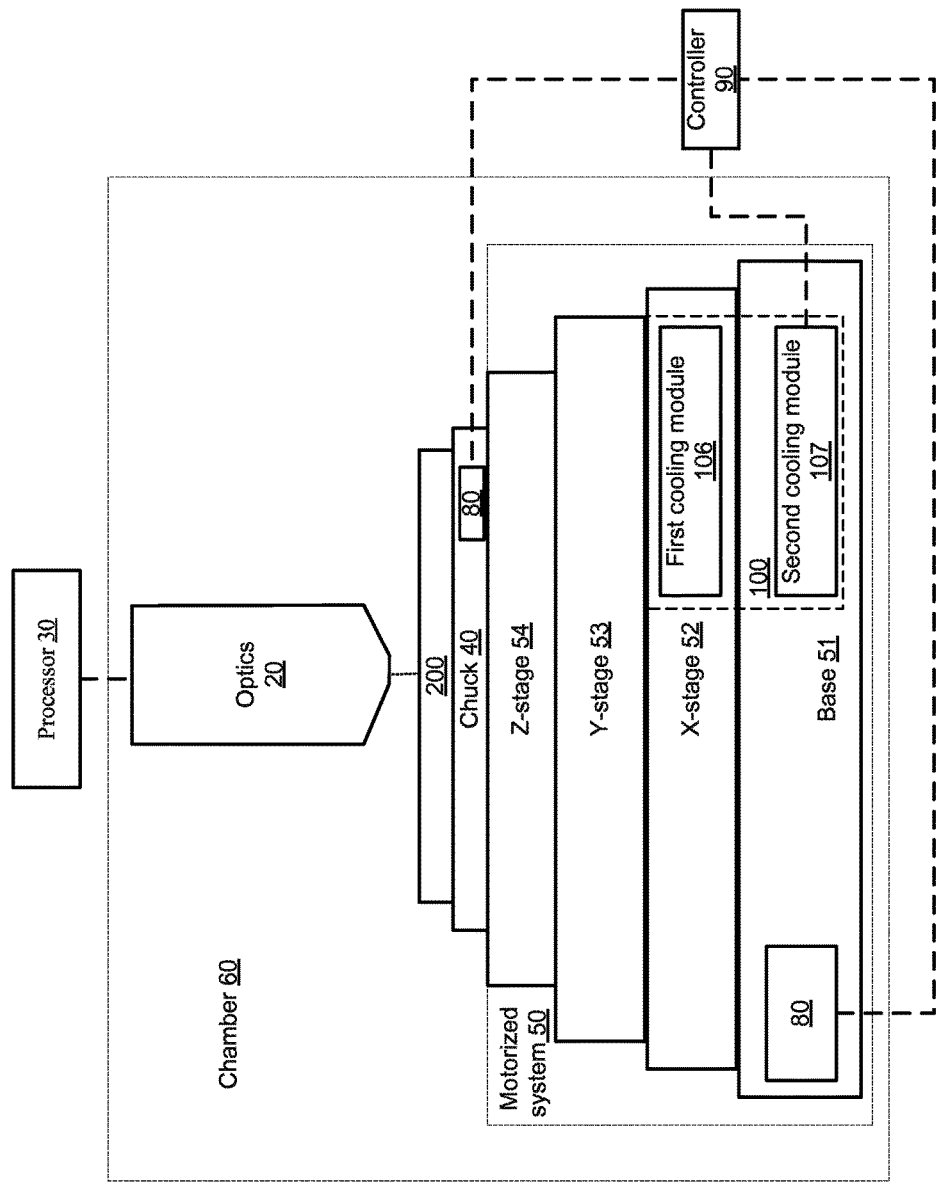
FIG. 8 illustrates a system and an object according to an embodiment of the invention.

FIG. 8 illustrates system 17 according to an embodiment of the invention.

FIG. 8 illustrates first cooling module 106 as directly cooling X-stage 52 and second cooling module portion 107 as directly cooling base 51. First cooling module 106 and second cooling module 107 may form cooling module 100.

Figure 9:
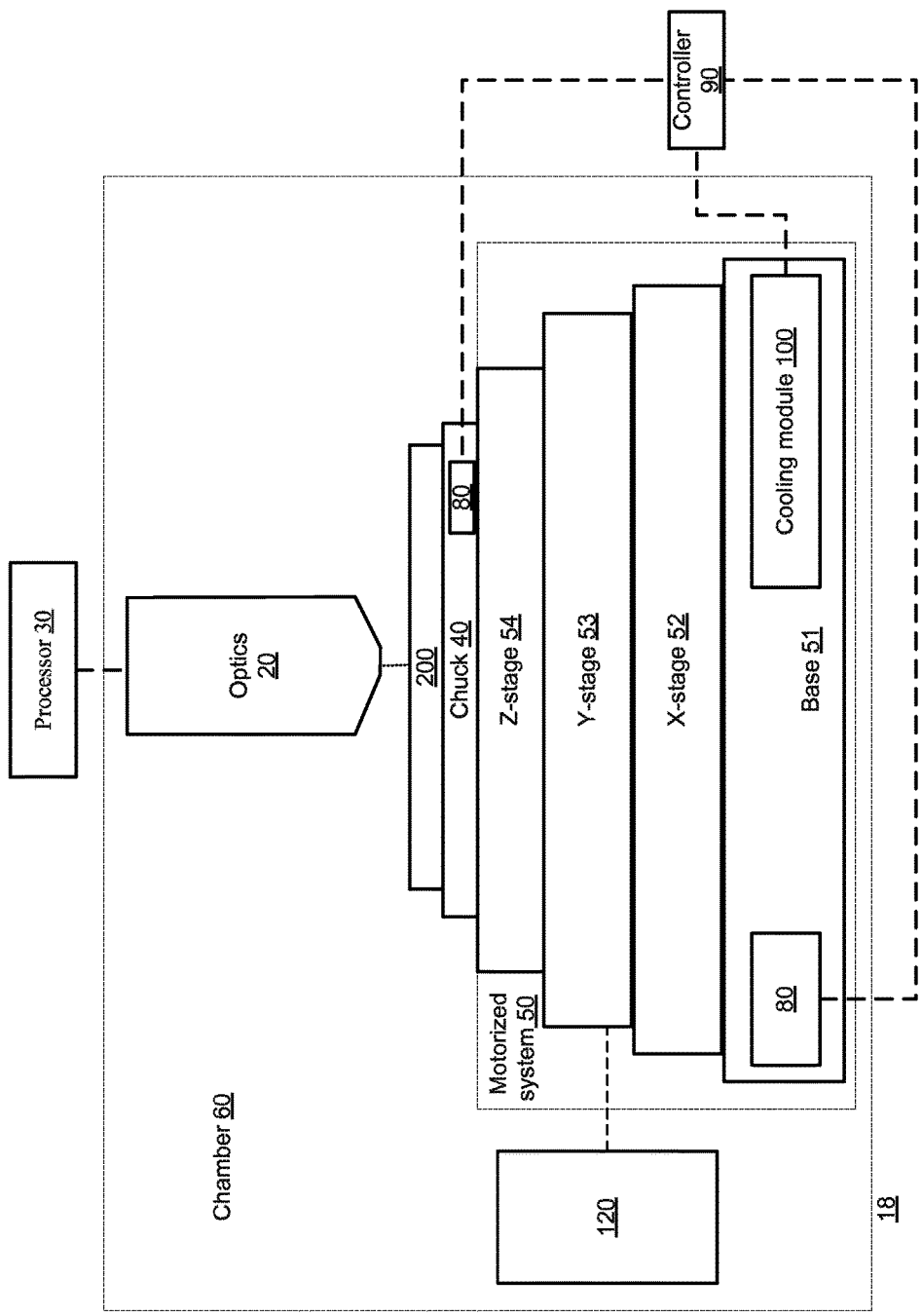
FIG. 9 illustrates a system and an object according to an embodiment of the invention.

FIG. 9 illustrates system 18 according to an embodiment of the invention.

FIG. 9 illustrates motorized system 50 as including a motorized system monitor 120 for monitoring the movements of motorized system 50. Motorized system monitor 120 may be an interferometer or any type of monitoring device.

Figure 10:
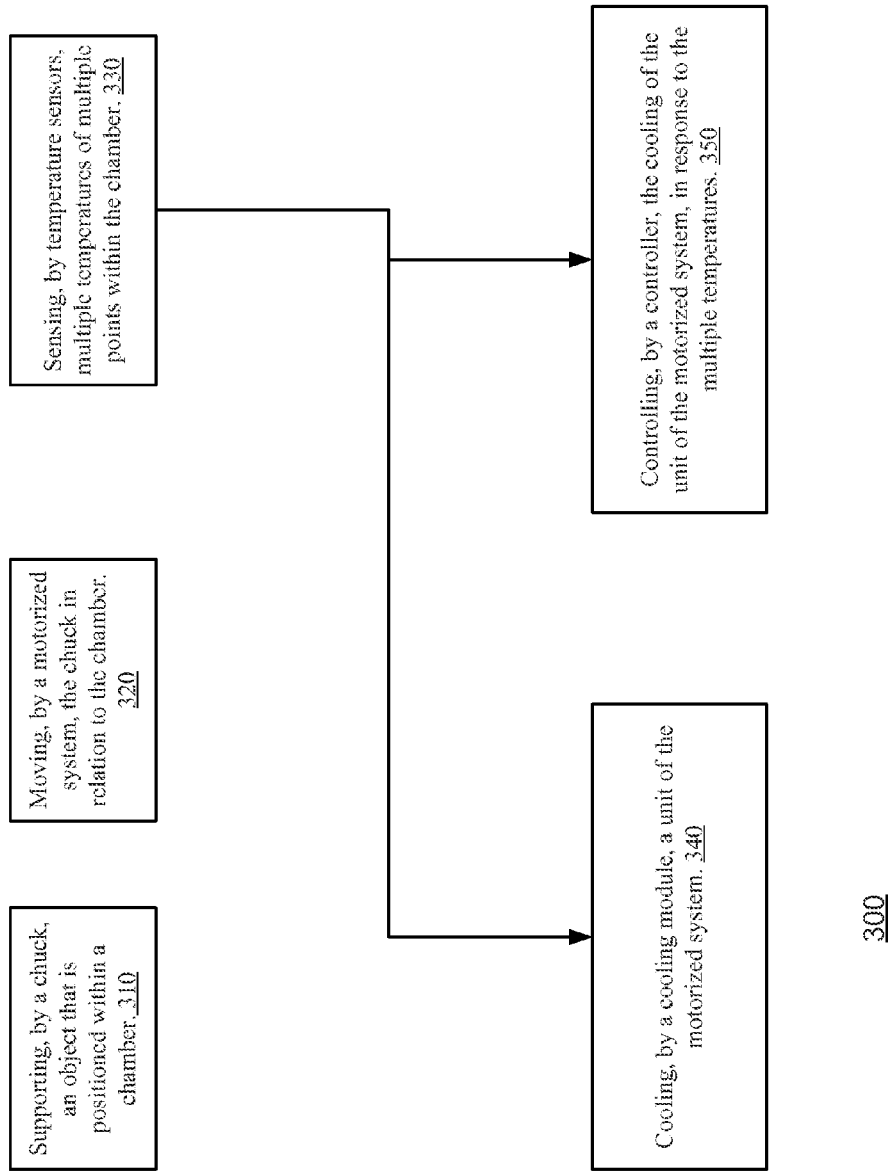
FIG. 10 illustrates a method according to an embodiment of the invention.

FIG. 10 illustrates method 300 according to an embodiment of the invention.

Method 300 includes steps 310, 320, 330, 340 and 350. Steps 310, 320, 330, 340 and 350 may be executed in parallel to each other, in a non-overlapping manner, or in a partially overlapping manner.

For example, method 300 may start by steps 310, 320 and 330.

Step 310 may include supporting, by a chuck, an object that is positioned within a chamber.

Step 320 may include moving, by a motorized system, the chuck in relation to the chamber.

Step 330 may include sensing, by temperature sensors, multiple temperatures of multiple points within the chamber.

Step 330 may be followed by steps 340 and 350.

Step 340 may include cooling, by a cooling module, a unit of the motorized system.

Step 350 may include controlling, by a controller, the cooling of the unit of the motorized system, in response to the multiple temperatures.

Figure 11:
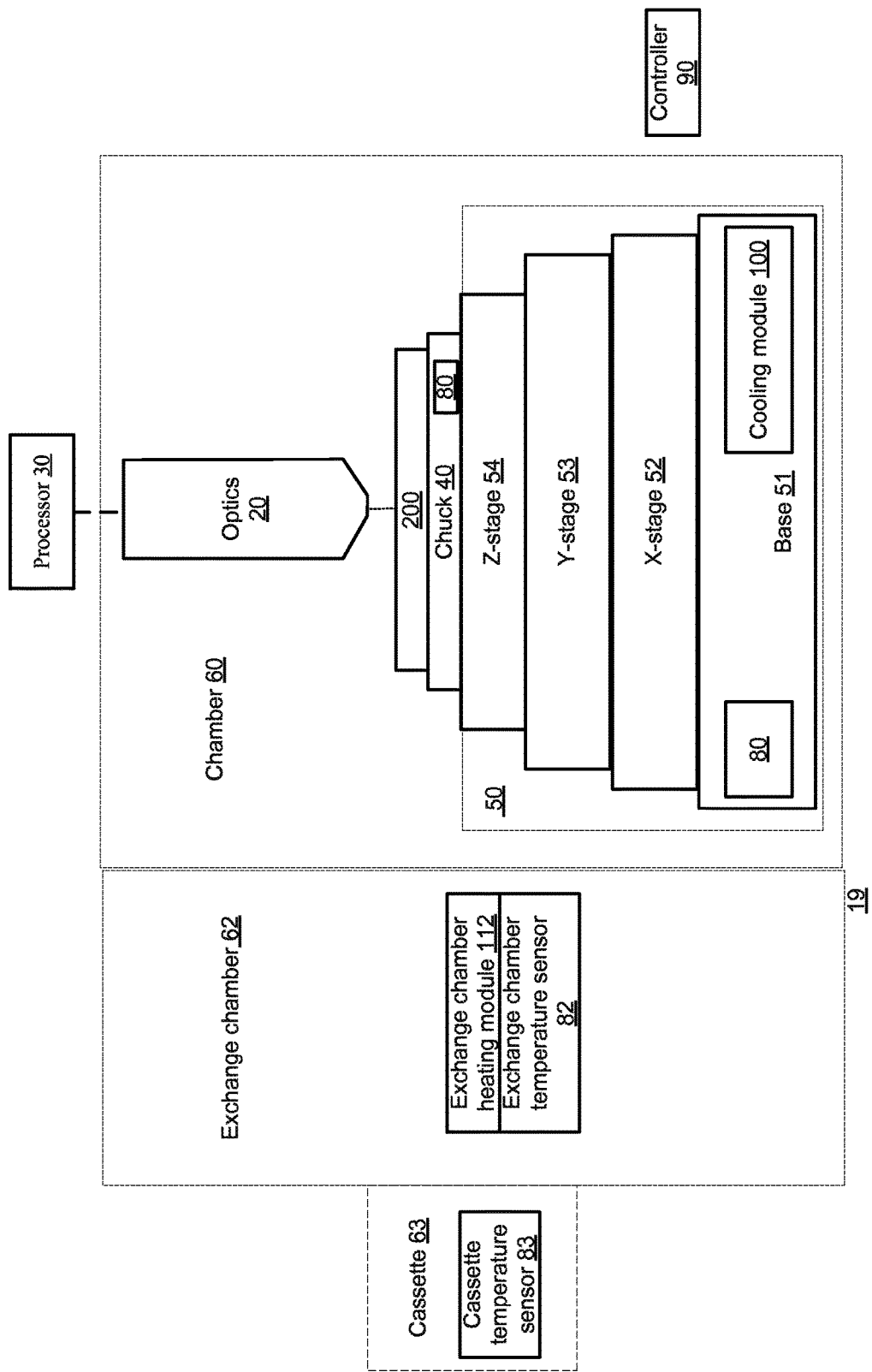
FIG. 11 illustrates a system and an object according to an embodiment of the invention.

FIG. 11 illustrates system 19 according to an embodiment of the invention.

System 19 of FIG. 11 differs from system 10 of FIG. 1 by including cassette 63 for holding wafers, cassette temperature sensor 83 for sensing the temperature of the cassette 63, exchange chamber 62 for exchanging a wafer between chamber 60 and cassette 63, exchange chamber temperature sensor 82 for sensing the temperature within the exchange chamber 62 and an exchange chamber heating module 112.

Exchange chamber heating module 112 is configured to heat a wafer to the temperature of chuck 40 or to any other temperature set by controller 90.

Cassette temperature sensor 83 and exchange chamber temperature sensor 82 may be regarded as belonging to the multiple temperature sensors of system 19.

Controller 90 may control cooling module 100 in response to temperature readings from cassette temperature sensor 83 and/or exchange chamber temperature sensor 82.

It is noted that system 19 may not include cassette temperature sensor 83 and/or exchange chamber heating module 112.

According to an embodiment of the invention the multiple sensors 80 include a chamber cover temperature sensor that is thermally coupled to a top cover of the chamber 60 and is configured to sense the temperature of the cover of chamber 60.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system comprising:
   a chamber;
   a chuck configured to support an object that is positioned within the chamber;
   a motorized system configured to move the chuck in relation to the chamber;
   optics arranged to illuminate specific locations of an object supported on the chuck with a beam;
   a processor configured to process images acquired by the optics and detect navigation errors that occur when the optics direct a beam to a certain location but the beam impinges on another location;
   a plurality of temperature sensors configured to sense multiple temperatures within the chamber, the plurality of temperature sensors including a first temperature sensor operatively coupled to sense a temperature of the chuck and a second temperature sensor operatively coupled to sense a temperature of the motorized system;
   a cooling module configured to cool a unit of the motorized system; and
   a controller configured to control the cooling module to cool the motorized system in response to to the first and second temperature sensors and the processor detecting a navigation error.

2. The system according to claim 1 wherein:
   the motorized system comprises a first mechanical stage and a second mechanical stage;
   the first mechanical stage is positioned between the chuck and the second mechanical stage; and
   the unit of the motorized system is the second mechanical stage.

3. The system according to claim 1 comprising a chuck heating module that is configured to heat the chuck.

4. The system according to claim 3 wherein chuck heating module is configured to heat the chuck in parallel to a cooling of the unit of the motorized system by the cooling module.

5. The system according to claim 3 wherein the chuck heating module is configured to change a temperature of the chuck within a first temperature range; and wherein the cooling module is configured to change a temperature of the unit of the motorized system within a second temperature range; and wherein the second temperature range exceeds the first temperature range.

6. The system according to claim 1 wherein the controller is configured to send movement commands for controlling movements introduced by the motorized system.

7. The system according to claim 6 wherein the controller is configured to control the cooling module in response to the movement commands and to the multiple temperatures.

8. The system according to claim 6 wherein the controller is configured to send temperature control commands to the cooling module before the multiple temperature sensors sense a change of temperature induced by the movements of the motorized system.

9. The system according to claim 6 wherein the controller is configured to send temperature control commands to the cooling module that when implemented by the cooling module prevent the movements of the motorized system from substantially altering the multiple temperatures sensed within the chamber.

10. The system according to claim 6 wherein the controller is configured to provide an estimated heat generated by the motorized system when executing the movement commands; and wherein the controller is configured to control the cooling module in response to the estimated heat.

11. The system according to claim 1 wherein the controller is configured to control the cooling module in response to the multiple temperatures by applying control iterations.

12. The system according to claim 11 wherein the controller is configured to determine whether to initiate a control iteration; and wherein the determining is responsive to navigation errors of the motorized system.

13. The system according to claim 1 wherein the motorized system comprises one or more movement stages that enable the motorized system to move the chuck in X, Y and Z dimensions and a base coupled to the one or more movement stages.

14. The system according to claim 13 wherein the cooling module is configured to cool the base of the motorized system.

15. The system according to claim 13 wherein the cooling module is configured to cool the one or more movement stages of the motorized system.

16. A method for maintaining a stable temperature within a chamber, the method comprising:

supporting, by a chuck, an object that is positioned within a chamber;

moving, by a motorized system, the chuck in relation to the chamber;

directing one or more beams towards the object from optics arranged to illuminate specific locations of the object while the object is supported on the chuck;

processing images acquired by the optics to detect navigation errors that occur when the optics direct a beam to a certain location of the object but the beam impinges a different location;

sensing, by multiple temperature sensors, multiple temperatures of at least one point within the chamber;

cooling, by a cooling module, a unit of the motorized system;

and controlling, by a controller, the cooling of the unit of the motorized system, in response to the multiple temperatures to compensate for navigation errors.

17. A system comprising:

a chamber;

a chuck configured to support an object that is positioned within the chamber;

a mechanical movement system configured to move the chuck in relation to the chamber, the motorized system comprising one or more movement stages that enable the motorized system to move the chuck in X, Y and Z dimensions and a stationary base coupled to the one or more movement stages, wherein the one or more movement stages generate heat when moving the chuck;

optics arranged to illuminate specific locations of an object supported on the chuck with a beam;

a processor configured to process images acquired by the optics and detect navigation errors that occur when the optics direct a beam to a certain location but the beam impinges a different location;

a first temperature sensor operatively coupled to sense a temperature of the chuck;

a second temperature sensor operatively coupled to sense a temperature of the motorized system;

a cooling module operatively coupled to cool the stationary base of the mechanical movement system; and a controller configured to control movements of the one or more movement stages and to control the cooling module in response to navigation errors detected by the processor and to the first and second temperature sensors.

* * * * *